(12) United States Patent
Feng et al.

(10) Patent No.: US 7,094,523 B1
(45) Date of Patent: Aug. 22, 2006

(54) DEVELOPER SOLUTION AND PROCESS FOR USE

(76) Inventors: Kesheng Feng, 269 Spruce St., Cheshire, CT (US) 06410; Daniel J. Hart, 849 Litchfield Rd., Watertown, CT (US) 06795

( * ) Notice: Subject to any disclaimer, the term of this patent is extended or adjusted under 35 U.S.C. 154(b) by 0 days.

(21) Appl. No.: 11/290,118

(22) Filed: Nov. 30, 2005

(51) Int. Cl.
*G03F 7/30* (2006.01)
*G03F 7/32* (2006.01)

(52) U.S. Cl. .................. 430/331; 430/311; 430/322

(58) Field of Classification Search ............. 430/311, 430/322, 331
See application file for complete search history.

(56) References Cited

U.S. PATENT DOCUMENTS

| 5,922,522 | A | 7/1999 | Barr et al. ............ 430/493 |
| 6,063,550 | A | 5/2000 | Lundy et al. ........... 430/331 |
| 6,248,506 | B1 | 6/2001 | Lundy et al. ........... 430/329 |
| 6,296,694 | B1 * | 10/2001 | Miller ................... 106/13 |
| 2005/0100833 | A1 | 5/2005 | Anzures et al. ......... 430/464 |

* cited by examiner

*Primary Examiner*—Hoa Van Le
(74) *Attorney, Agent, or Firm*—Carmody & Torrance LLP

(57) ABSTRACT

An improved composition and method for the development of resists is disclosed. The method comprises contacting the resist with a developer solution comprising a source of alkalinity and a cationic surfactant which is an ethoxylated and/or propoxylated tallow amine. The improved developer solution more effectively removes the uncured resist from the resist coated surface.

12 Claims, No Drawings

DEVELOPER SOLUTION AND PROCESS FOR USE

BACKGROUND OF THE INVENTION

The present invention is directed to alkaline aqueous development solutions for use in developing photo-resists.

Photo-resists are used to image patterns in a wide variety of applications such as printed circuit boards. In the case of printed circuit boards, the photo-resist is blanket coated or laminated to a copper clad core such that the photo-resist initially covers the copper. The photo-resist works by selectively exposing certain areas of the photo-resist to light, usually ultraviolet light, in the image of the desired pattern, thereby generating areas of photo-resist exposed to light and areas not exposed to light. The areas of the photo-resist exposed to light cross-link or polymerize thereby making those areas less soluble in the subsequent developer solution.

The exposed photo-resist is then exposed to a developer solution which will dissolve or strip the unexposed areas of the photo-resist but leave in tact the exposed areas of the photo-resist. For many photo-resists, the developer solution comprises a mildly alkaline aqueous solution which can be as simple as an aqueous solution of sodium or potassium carbonate (typically about 1% by weight). The optimum developer solution will effectively dissolve or strip all of the unexposed photo-resist areas from the substrate but leave all of the exposed areas of photo-resist fully in tact on the substrate and will accomplish this in a quick manner. This ideal development will thus leave portions of the substrate uncovered for subsequent treatment but other areas of the substrate covered to protect them from subsequent treatment.

Problems can occur in this development process if the developer solution (i) fails to completely remove all of the unexposed photo-resist, (ii) leaves residue on, or fails to leave clean, the substrate under the unexposed photo-resist and/or (iii) allows photo-resist residues to redeposit on areas of the substrate under the unexposed photo-resist. If any of the foregoing conditions exist, then the subsequent processing, intended to act selectively upon the areas of the substrate that were (previously) covered by now stripped unexposed photo-resist, will be ineffective or interfered with. Thus it is critical that the developer solution effectively strip all of the unexposed photo-resist leaving clean areas of substrate behind.

It is an object of this invention to disclose an improved developer solution for photo-resists that will more effectively strip all of the unexposed photo-resist from substrates and leave behind clean areas of substrate that are properly prepared for subsequent processing.

SUMMARY OF THE INVENTION

This invention is directed to an aqueous developer solution that comprises a source of alkalinity and a cationic surfactant. Preferably, the cationic surfactant is an ethoxylated and/or propoxylated tallow amine and most preferably has the following structure:

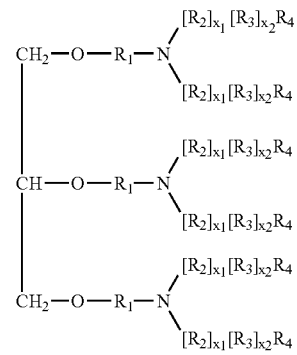

where:
$R_1$=fatty acid group;
$R_2$=—H, —$CH_2CH_2O$—, or —$CH_2CH(CH_3)O$—
$R_2$=—H;
$R_3$=—H, —$CH_2CH_2O$—, or —$CH_2CH(CH_3)O$—;
$R_4$=—H if $x_2$ is zero, alkyl, aryl, or alkaryl;
sum of all $x_1$=an integer totaling from 3 to 30;
sum of all $x_2$=an integer totaling 0 to 15.

Preferably the source of alkalinity is a weakly basic substance such as sodium or potassium carbonate. The concentration of the source of alkalinity should be such that the pH of the developer solution is from about 9 to 12.

DETAILED DESCRIPTION OF THE INVENTION

The inventors of this invention have discovered that organic resists can be more effectively developed using an aqueous developer solution comprising:
(a) a source of alkalinity; and
(b) a cationic surfactant The source of alkalinity in the aqueous developer solution is preferably a mildly basic substance such as sodium carbonate and/or potassium carbonate. The concentration of sodium or potassium carbonate is preferably from about 5 to 20 g/l. The pH of the aqueous developer solution is preferably from about 9 to 12.

The cationic surfactant is preferably an ethoxylated and/or propoxylated tallow amine. Most preferably the cationic surfactant has the following structure:

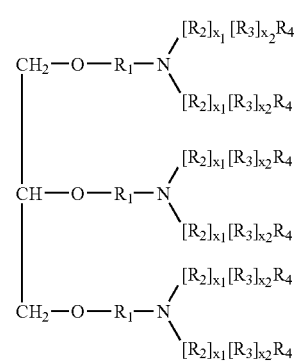

where:
$R_1$=fatty acid group;

$R_2$=—H, —$CH_2CH_2O$—, or —$CH_2$ $CH(CH_3)O$—
$R_2$=—H;
$R_3$=—H, —$CH_2CH_2O$—, or —$CH_2$ $CH(CH_3)O$—;
$R_4$=—H if $x_2$ is zero, alkyl, aryl, or alkaryl;
sum of all $x_1$=an integer totaling from 3 to 30;
sum of all $x_2$=an integer totaling 0 to 15.

Preferably the fatty acid group is a fatty acid component of tallow and comprises one or more fatty acids selected from the group consisting of myristic acid, myristoleic acid, pentadecanoic acid, palmitic acid, palmitoleic stearic acid, oleic acid, linoleic acid, alpha-linoleic acid and mixtures of the foregoing. Preferably $R_2$ is —$CH_2$ $CH(CH_3)O$—. Preferably $R_3$ is H or —$CH_2CH(CH_3)O$—. Preferably $R_4$ is H or nothing if $R_3$ is H. Preferably the sum of all $x_1$, is an integer totaling 15 and the sum of all $x_2$ is an integer totaling 2. Most preferably, $R_1$, comprises the following distribution of fatty acids:

| | |
|---|---|
| 2.9–3.0% | myristic acid |
| 0.3–0.1% | myristoleic acid |
| 0.5–0.6% | pentadecanoic acid |
| 24.0–25.8% | palmitic acid |
| 2.0–2.5% | palmitoleic acid |
| 20.0–21.5% | stearic acid, oleic acid |
| 42.6–43.0% | oleic acid |
| 2.3–4.0% | linoleic acid |
| 0.2–0.5% | alpha-linoleic (linolenic) acid |

A commercially available cationic surfactant that has been found to be useful in this invention is Chemeen T-15 LF® available from Rutgers Organics. The concentration of the cationic surfactant in the aqueous developer solution is preferably from about 0.1 to 3 percent by weight.

The aqueous developer solution of this invention can also comprise other components. One such optional but useful component is an anti-foam. Anti-Foam may be necessary because of the foaming action of the cationic surfactant and/or because of the foaming action of some of the resist constituents that are dissolved or leached into the developer solution during use. Typical anti-foam agents that are known in the art can be used for these purposes.

In addition to anti-foam other useful but optional ingredients include organic solvents such as mono and diakyl ethers of ethylene glycol typically sold under the tradename, "CELLOSOLVE". Butyl Cellosolve, methyl cellosolve and/or cellosolve acetate (or other similar organic solvents) can be added to the developer solution. These aqueous miscible organic solvents can increase the developer's ability to remove certain resists. If used, the concentration of organic solvent in the developer solution is preferably from about 0 to 2 percent by weight.

As noted, the developer solution is used to selectively remove unpolymerized or uncured resists from surfaces so that the remaining polymerized or cured resist covers the surface in the desired image. Typically the resist covered surface to be developed is contacted with the developer solution for a time and at a temperature sufficient for the developer solution to selectively remove the uncured resist from the surface but leave the cured resist, in the desired image, on the surface intact. The method of contact can be by immersion, flood, or spray, but spray is preferred. The temperature of the developer solution is preferably from about 60° F. to about 130° F. Typical contact times for spray range from about 10 seconds to about 2 minutes. Time, temperature and contact method are varied such that the developer solution cleanly removes the uncured resist but leaves cured resist in tact.

EXAMPLE 1

Several sample copper surfaces were coated with Microtrace® photo-resist available from MacDermid Incorporated of 245 Freight Street, Waterbury, Conn. 06702. The photo-resist was then selectively cured by exposing it to ultraviolet light through a photo-graphic negative. The surfaces were then developed using an aqueous solution of 1% by weight potassium carbonate and varying concentrations of Chemeen T-15 LF® surfactant and notation was made as to the quality of development with 1 being best and 5 being worst. The results were as follows:

| Chemeen T-15 LF | |
|---|---|
| Concentration (wt. %) | Quality Development |
| 0.0 | 5 |
| 0.1 | 5 |
| 0.5 | 4 |
| 1.0 | 3 |
| 2.0 | 1 |

We claim:

1. An aqueous developer composition comprising:
   a. a source of alkalinity; and
   b. a cationic surfactant of the following structure:

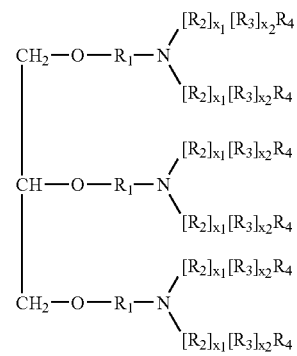

where:
$R_1$=fatty acid group;
$R_2$=—H, —$CH_2CH_2O$—, or —$CH_2CH(CH_3)O$—
$R_2$=—H;
$R_3$=—H, —$CH_2CH_2O$—, or —$CH_2$ $CH(CH_3)O$—;
$R_4$=—H if $x_2$ is zero, alkyl, aryl, or alkaryl;
sum of all $x_1$=an integer totaling from 3 to 30;
sum of all $x_2$=an integer totaling 0 to 15.

2. A composition according to claim 1 wherein $R_1$ is selected from the group consisting of myristic acid, myristoleic acid, pentadecanoic acid, palmitic acid, palmitoleic acid, stearic acid, oleic acid, linoleic acid, alpha-linoleic acid and mixture of any or all of the foregoing.

3. A composition according to claim 2 wherein the composition also comprises one or more materials selected from the group consisting of anti-foam and water miscible organic solvents.

4. A composition according to any one of claims 1, 2, or 3 wherein $R_2$ is —$CH_2$ CH ($CH_3$)O—.

5. A composition according to any one of claims 1, 2, or 3 wherein $R_3$ is H or —$CH_2$ CH ($CH_3$)O—.

6. A composition according to any one of claims 1, 2, or 3 wherein the sum of all $x_1$, is an integer totaling 15 and the sum of all $X_2$ is an integer totaling 2.

7. A method of developing a resist coated surface said method comprising: contacting the resist coated surface comprising areas of cured resist and areas of uncured resist with a developer composition comprising:
 a. a source of alkalinity; and
 b. a cationic surfactant of the following structure.

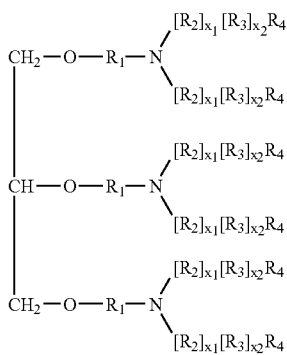

where:
 $R_1$=fatty acid group;
 $R_2$=—H, —$CH_2CH_2O$—, or —$CH_2$ $CH(CH_3)O$— $R_2$=—H;
 $R_3$=—H, —$CH_2CH_2O$—, or —$CH_2$ $CH(CH_3)O$—;
 $R_4$=—H if $x_2$ is zero, alkyl, aryl, or alkaryl;
 sum of all $x_1$=an integer totaling from 3 to 30;
 sum of all $x_2$=an integer totaling 0 to 15.

8. A method according to claim 7 wherein $R_1$ is selected from the group consisting of myristic acid, myristoleic acid, pentadecanoic acid, palmitic acid, palmitoleic acid, stearic acid, oleic acid, linoleic acid, alpha-linoleic acid and mixture of any or all of the foregoing.

9. A method according to claim 8 wherein the composition also comprises one or more materials selected from the group consisting of anti-foam and water miscible organic solvents.

10. A method according to any one of claims 7, 8 or 9 wherein $R_2$ is —$CH_2CH(CH_3)O$—.

11. A method according to any one of claims 7, 8, or 9 wherein $R_3$ is H or —$CH_2$ CH ($CH_3$)O—.

12. A method according to any one of claims 7, 8, or 9 wherein the sum of all $x_1$, is an integer totaling 15 and the sum of all $X_2$ is an integer totaling 2.

* * * * *